(12) United States Patent
Allen et al.

(10) Patent No.: US 7,103,526 B2
(45) Date of Patent: Sep. 5, 2006

(54) METHOD AND APPARATUS FOR ADAPTING A SIMULATION MODEL TO EXPOSE A SIGNAL INTERNAL TO THE MODEL TO A CLIENT APPLICATION

(75) Inventors: Richard Craig Allen, Union City, CA (US); Randy A Coverstone, Newark, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 104 days.

(21) Appl. No.: 10/272,078

(22) Filed: Oct. 16, 2002

(65) Prior Publication Data

US 2004/0078181 A1 Apr. 22, 2004

(51) Int. Cl.
*G06F 9/45* (2006.01)
*G06F 17/50* (2006.01)
*G06F 7/48* (2006.01)
*G06F 9/44* (2006.01)

(52) U.S. Cl. ............... 703/21; 716/1; 703/1; 703/7; 703/20

(58) Field of Classification Search ............... 703/22; 716/1
See application file for complete search history.

(56) References Cited

U.S. PATENT DOCUMENTS

| | | | | |
|---|---|---|---|---|
| 5,603,014 A * | 2/1997 | Woodring et al. | ............ | 703/22 |
| 5,623,419 A * | 4/1997 | Kundert | ......................... | 716/5 |
| 5,790,565 A * | 8/1998 | Sakaguchi | .................. | 714/738 |
| 6,018,781 A * | 1/2000 | Goeppel | ...................... | 710/115 |
| 6,171,109 B1 * | 1/2001 | Ohsuga | ....................... | 434/118 |
| 6,188,975 B1 * | 2/2001 | Gay | ............................ | 703/22 |
| 6,218,861 B1 * | 4/2001 | Sudo et al. | .................... | 326/46 |
| 6,252,583 B1 * | 6/2001 | Braun et al. | ................ | 345/156 |
| 6,295,513 B1 * | 9/2001 | Thackston | ..................... | 703/1 |
| 6,332,163 B1 * | 12/2001 | Bowman-Amuah | ......... | 709/231 |
| 6,484,280 B1 * | 11/2002 | Moberly | ..................... | 714/726 |
| 6,711,716 B1 * | 3/2004 | Mueller et al. | ................ | 716/1 |
| 6,937,969 B1 * | 8/2005 | Vandersteen et al. | ......... | 703/14 |
| 6,941,258 B1 * | 9/2005 | Van Heijningen et al. | .... | 703/16 |
| 2002/0069215 A1 * | 6/2002 | Orbanes et al. | ............ | 707/500 |
| 2002/0123874 A1 * | 9/2002 | Roesner et al. | ............... | 703/17 |

OTHER PUBLICATIONS

Laney-J. "Writing test modules using standard interfaces and lanuages" IEEE Autotestcon Proceedings. p. 339-341 (2000).*
Murthy-P. "System Canva: A New Design Enviroment for Embedded DSP and Telecommunication Systems" Angelas Design Syst. IEEE 9th International Workshop on Hardware Software C-Design 2001 p. 54-59.*
Chang et al., "Fast Time Domain Simulation in SPICE with Frequency Domain Data" IEEE 1997. p. 689-695.*
Verspecht et al., "System Level Simulation Benefits from Frequency Domain Behavioral Models of Mixers and Amplifiers" 1999. Agilent Technologies. p. 1-5.*

* cited by examiner

*Primary Examiner*—Paul L Rodriguez
*Assistant Examiner*—Tom Stevens

(57) ABSTRACT

A method for exposing the internal signals of a system model or software model of a dynamic system to a client application outside the original modeling environment is provided. A designer of the system model is provided with a way to select internal signals of the system model in order to expose those internal signals to other computer applications external to the modeling environment. Such computer applications are then able to access the internal signals by way of interfacing software while the system model is being exercised within the modeling environment, or while a software model based on the system model is executed outside of that environment.

21 Claims, 8 Drawing Sheets

METHOD AND APPARATUS FOR ADAPTING A SIMULATION MODEL TO EXPOSE A SIGNAL INTERNAL TO THE MODEL TO A CLIENT APPLICATION

BACKGROUND OF THE INVENTION

Dynamic systems, which are human-devised systems that respond in some beneficial way to changing conditions within their environment, represent a significant challenge to the designers of such systems due to the myriad and diverse conditions such systems must be capable of handling effectively. For example, electrical and electronic circuits, which represent but one type of dynamic system, often must react to ever-changing input signals by providing output signals based on the input signals, thereby causing some favorable action in the environment in which the system operates. Electrical and electronic circuits are utilized to great advantage in a plethora of applications, from everyday consumer appliances, such as microwave ovens and personal computers, to high-tech military weaponry. Additionally, dynamic systems also include any type of software written to perform a specific, useful function. Furthermore, dynamic systems may include, but are not limited to, those based on electrical, software, mechanical, pneumatic, or chemical principles, or some combination thereof.

The task of designing dynamic systems has been greatly enhanced by continual improvements in the technology of system simulation. Such simulation allows models of dynamic system designs to be tested initially without the need of expensive prototypes that are difficult to both build and maintain. Through simulation, any imaginable set of test conditions may be employed to thoroughly exercise a preliminary system design. The results of those tests may then be used by the system designer to analyze the performance of the system. Typically, changes are then made based on the results of the tests, the tests are rerun, and the results are analyzed once again to determine the positive or negative effect of the changes. Thus, simulation allows the design of the dynamic system to be improved by way of an iterative process prior to the actual construction of the system under test, resulting in faster and more productive system development.

A specific example of such a modeling environment is the Simulink® system definition and simulation tool by The Mathworks, Inc. As shown in FIG. 2, a modeling environment 210 allows a system designer to specify a dynamic system, whether it is electrical, mechanical or otherwise, by way of a system model 1 possessing characteristics as determined by the designer. An example of the system model 1 is shown in FIG. 1. The system model 1 consists of several functional blocks 2, each of which performs some identifiable task within the system model 1. Ordinarily, one or more input signals 3 and output signals 4 (or, collectively, external variables) are utilized by the dynamic system represented by the model 1 to communicate with and influence the surrounding environment. Internal signals 5 of the system model 1 allow the functional blocks 2 to communicate, thereby allowing cooperation among the functional blocks 2 to perform the overall function of the dynamic system. Most modeling environments 210, such as Simulink, also allow hierarchical design, as each block 2 of the system model 1 may further consist of sub-blocks (not shown) representing various functions within the associated higher-level block 2.

Additionally, the functional blocks 2 within the system model 1 may be predefined functional blocks (e.g., differentiation or integration functional blocks) that are normally made available within the modeling environment 210, while others are later-defined functional blocks whose behavior may be specified by the system designer. Such later-defined blocks may be specified within the Simulink environment by way of "S-functions," which allow the behavior of the block to be specified by way of user-supplied or third-party-supplied software, which may be written in any of several different languages, including C, Ada, and Fortran.

As seen in FIG. 2, the system model 1 specified in the Simulink environment may then be simulated within that same environment using input signals 3 devised by the system designer. The analysis, subsequent design changes, and further simulation of the model normally all occur within the purview of the Simulink tool. To enhance this process, Simulink allows access to the internal signals 5 of the system model 1 that help define the behavior of the proposed system. Specifically, the internal signals allow the designer more insight into the operations of the system model 1. Thus, access to these internal signals 5 makes the entire simulation and analysis process more efficient.

A related code-generation tool 220, such as that provided by The Mathworks, called the Real-Time Workshop® (RTW), takes system models originally developed within the modeling environment 210 as input, and generates code that is a software model 230 representing the system model. The software model 230 can be generated in one of several different programming languages, including C, Ada, and others. The software model 230 may then be transferred to and executed on another platform, with the execution of the software model 230 possibly progressing in real-time, depending on the nature of the platform. In the case of software systems, the platform may be the target platform ultimately used to implement the system, thus providing a nearly seamless progression from system model generation to production-level code.

Unfortunately, the system internal signals 5 of FIG. 1 that are initially accessible in the simulation environment 210 are often no longer accessible on the platform executing the software model 230 without additional model-specific software that has been specially created by the designer. In an effort to remedy this situation within the Mathworks environment, the RTW tool provides an "external mode" option, which allows the designer access to the internal signals of the software model 230 when accessed via the Simulink environment. In external mode, such internal signal access via Simulink is possible whether the software model is executed on the same platform which is executing Simulink, or on another platform which is connected to the Simulink platform by way of a communications link, such as Transmission Control Protocol/Internet Protocol (TCP/IP). However, the form and quality of access to the internal signals of that code running on a separate platform is dependent upon the capabilities of Simulink, as well as the availability of a communications connection between the Simulink platform and the platform hosting the RTW-generated code. The ability to access the internal variables of an executing software model by way of a client application residing outside the original modeling environment is currently not available.

Therefore, from the foregoing, methods that automatically allow access to the internal signals of a system model by way of that system model, or by way of a software model generated from the system model, from outside of the original modeling environment would be advantageous. Such methods would allow the system designer greater flexibility in the platforms upon which to simulate the system model, as well as possibly allow the designer more flexible and effective access to the internal signals of either of the two models.

SUMMARY OF THE INVENTION

Embodiments of the present invention, to be discussed in detail below, represent a method for exposing the internal signals of a system model or software model of a dynamic system to a client application executing outside the original modeling environment. Means are provided within the modeling environment that allow the designer of the system model to select internal signals of the system model for exposure to the client application. The client application is then allowed access to the internal signals by way of interfacing software while the system model is being exercised within the modeling environment, or while the software model is executed outside of that environment.

Thus, embodiments of the invention allow access to internal variables of the system model or software model that were previously inaccessible to client applications outside of the modeling environment. Such applications may be written specifically for the model being exercised to examine such data in ways that are not available within the modeling environment.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Embodiments of the invention, as described in detail below, utilize as a starting point the Mathworks Simulink® modeling environment described above. However, other simulation model environments may be employed in a similar fashion as the basis for alternate embodiments of the present invention.

Furthermore, the software of alternate embodiments of the invention may be manifested in varying levels of integration with the associated modeling environment. For example, alternate embodiments may include distinct follow-on software that is installed separately from the modeling environment. Other embodiments, like those specifically discussed herein, may involve software developed independently, but integrated within the modeling environment. Also, other embodiments may represent code that is highly integrated to the point that such code is indistinguishable by an outside observer from that which comprises the remainder of the modeling environment.

Figure 3:
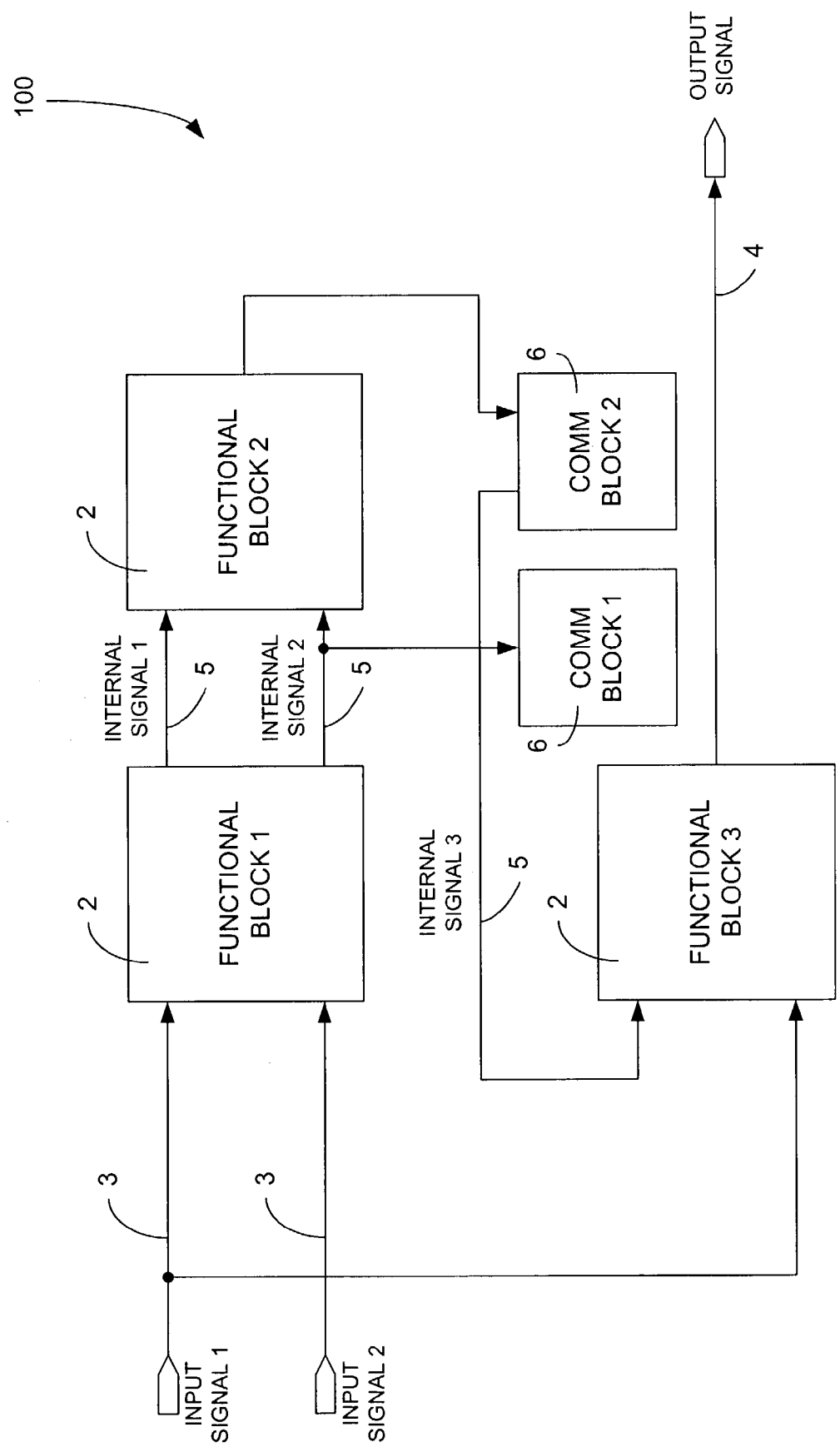
FIG. 3 is a block diagram of a system model that has been "decorated" according to an embodiment of the invention.
Figure 4:
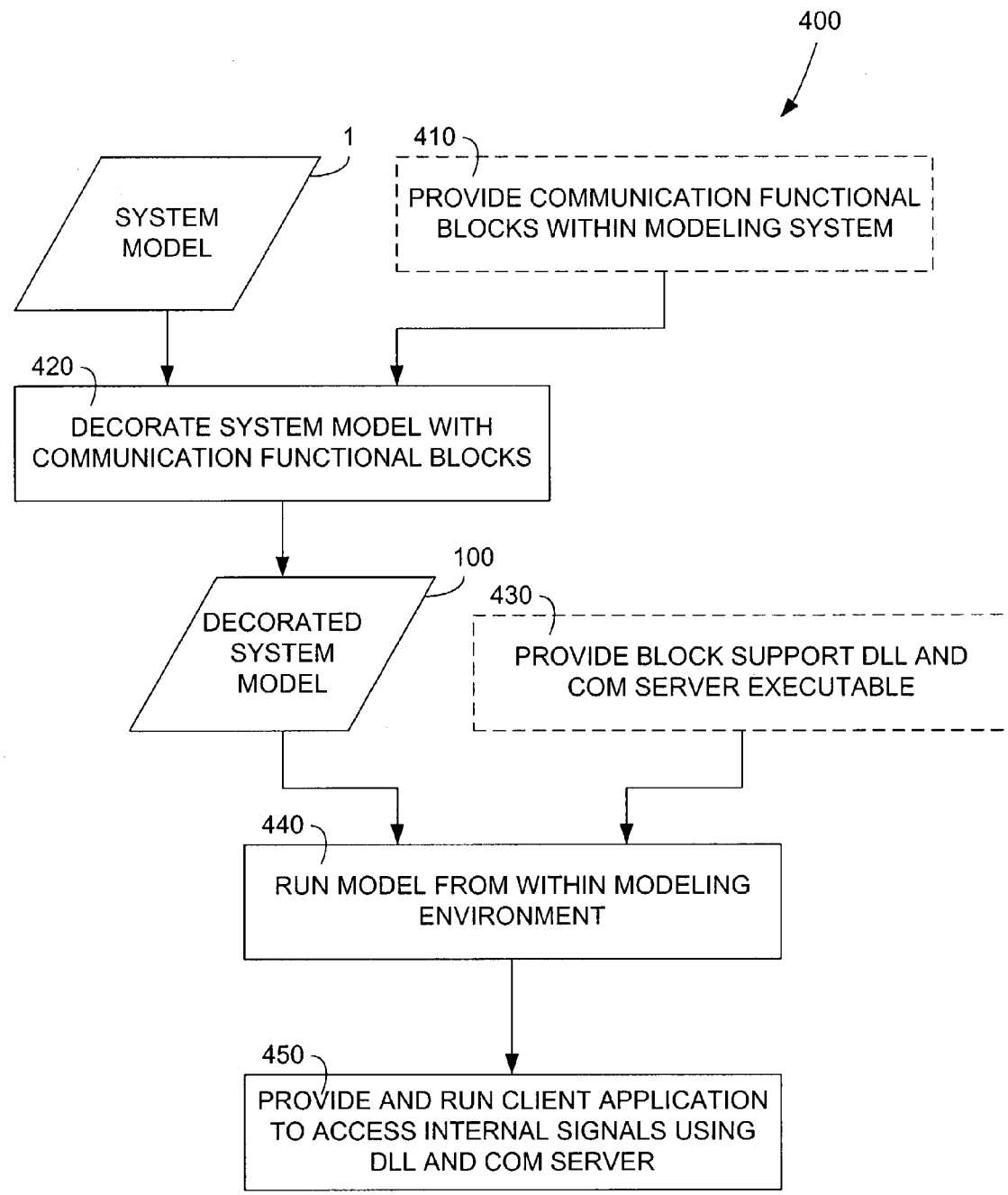
FIG. 4 is a flow chart of a method according to an embodiment of the invention of developing a system model that allows access to its internal signals.
Figure 5:
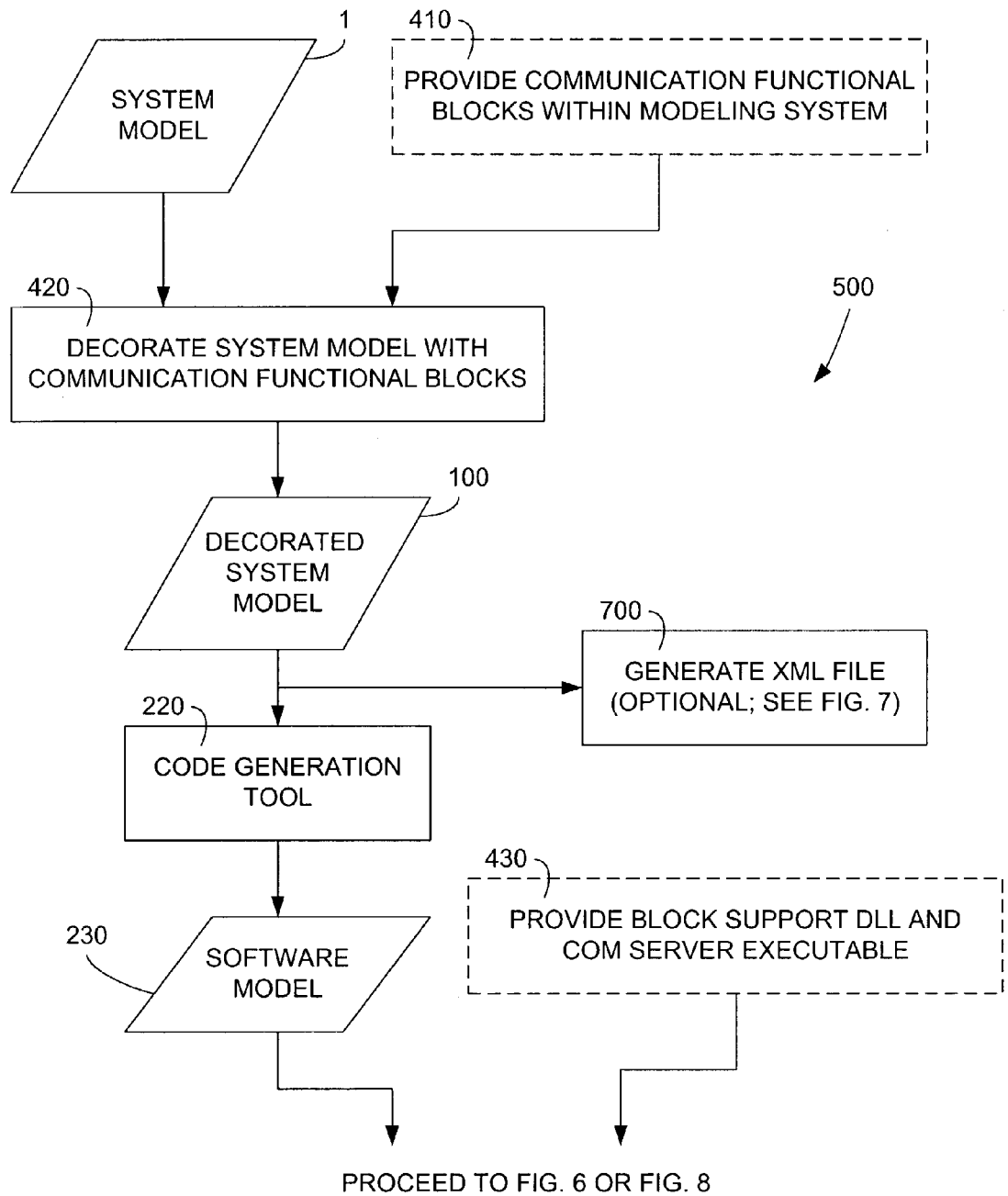
FIG. 5 is a flow chart of the initial portion of a method according to an embodiment of the invention of developing a software model, generated from the system model of FIG. 4, that allows access to its internal signals.

FIG. 4 and FIG. 5 each show integrated representations 400 and 500 of the steps provided by embodiments of the invention, interspersed with steps performed by the system designer or other users. FIG. 4 involves the direct use of a decorated system model 100 of FIG. 3, while FIG. 5 describes the use of a software model 230, which is generated from the decorated system model 100. The steps directly associated with embodiments of the invention are indicated by way of blocks with dashed borders.

First, as shown in both FIG. 4 and FIG. 5, embodiments of the present invention provide a set of communication functional blocks 6 (from FIG. 3) for use in a model defined by the user (step 410 of FIG. 4 and FIG. 5). The communication functional blocks 6 typically are predefined blocks or third-party-defined blocks that reside in a library within the modeling environment. Like other functional blocks that may reside within a library supplied with the modeling environment, the communication functional blocks 6 are available to be utilized and modified by the system designer.

Figure 1:
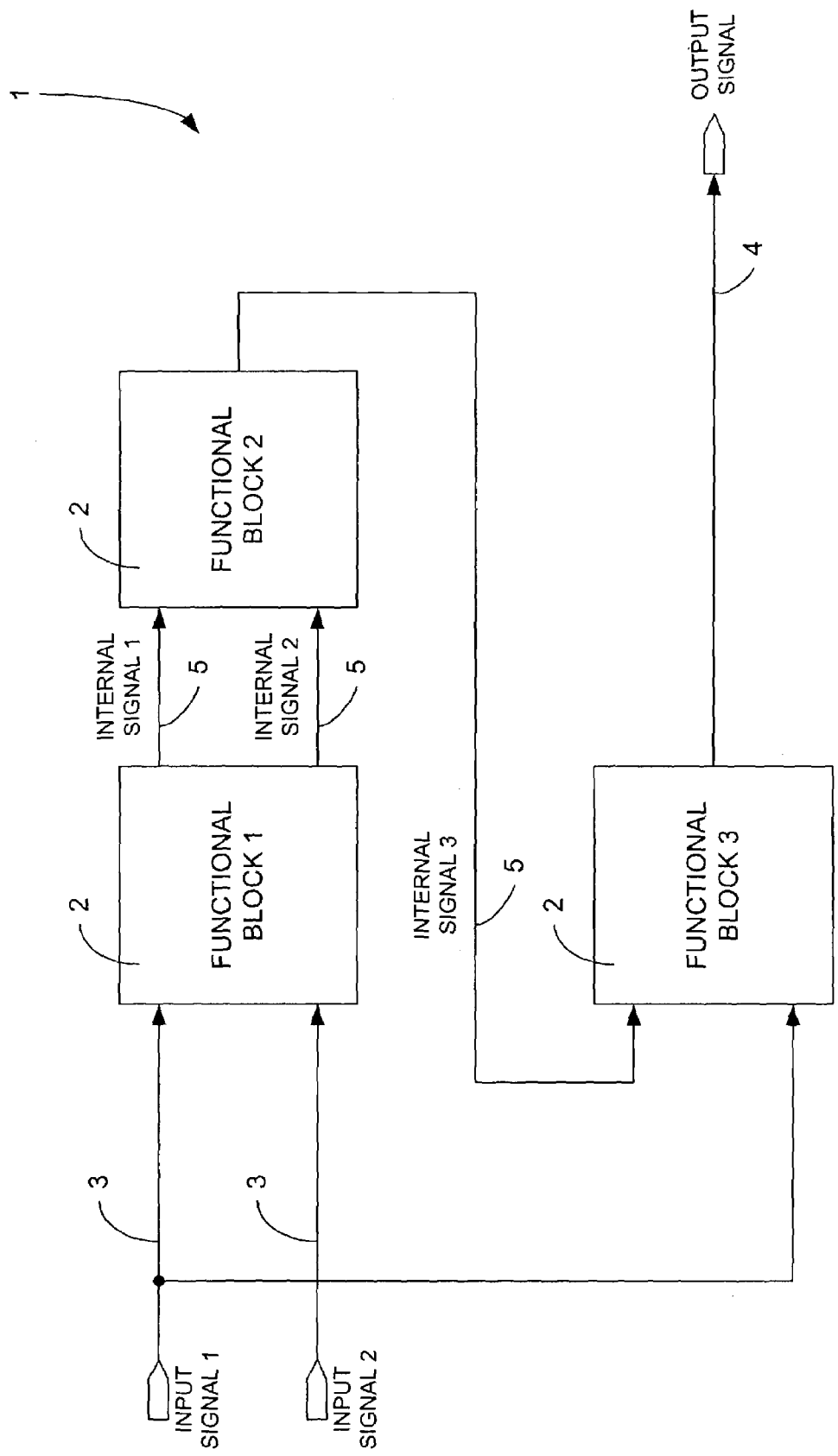
FIG. 1 is a block diagram of a system model that may be represented within the Simulink modeling environment, as well as other modeling environments.
Figure 2:
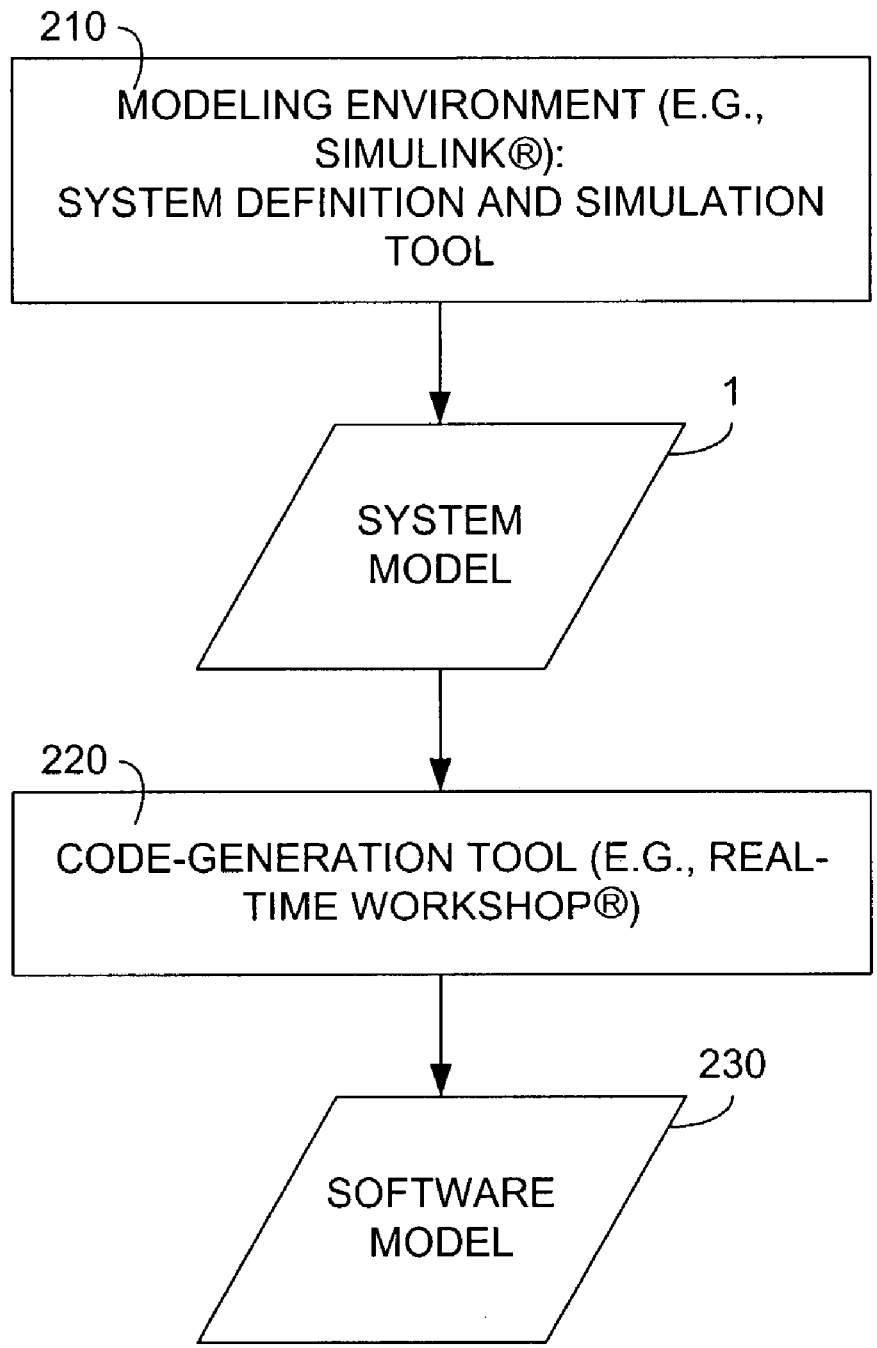
FIG. 2 is a flow chart of a method from the prior art of developing a system model and a software model of a dynamic system.

Within FIG. 4 and FIG. 5, the system designer modifies a system model 1 (from FIG. 1) by adding to, or "decorating", system model 1 with one or more of the communication functional blocks 6 (step 420 of FIG. 4 and FIG. 5), resulting in the decorated system model 100, shown in detail in FIG. 3. The communication blocks 6 are placed by the system designer with the purpose of selecting internal signals 5 of the decorated system model 100 that are to be exposed to applications that run concurrently with execution of either the decorated system model 100 (see FIG. 4) or the software model 230 that has been generated from the decorated system model 100 (see FIG. 5). Each communication block 6 is employed to expose a particular internal signal 5 within the decorated system model 100. Therefore, the system designer controls which internal signals 5 are exposed to applications outside of the environment in which the decorated system model 100 resides. In other words, the system designer would assign communication blocks 6 to only those signals that the designer desires to expose. In FIG. 3, for example, COMM BLOCK 1 is employed to expose INTERNAL SIGNAL 2, while COMM BLOCK 2 is used for both read and write access of INTERNAL SIGNAL 3. In this case, the designer has chosen to not expose INTERNAL SIGNAL 1. That signal may not be changeable, or may be of no interest to the designer, or some other reason may exist as to why exposure of that internal signal 5 is not desired.

Within the Simulink modeling environment, the communication functional blocks 6 are provided by embodiments of the invention for the designer as part of a functional block library. Each of the possible communication blocks 6 typically has a masked dialog box associated with it that is presented to the designer upon instantiation of such a block within the decorated system model 100. Such dialog boxes allow customization of the functional block with which each is associated. In the case of the communication functional blocks 6, the associated dialog box allows the designer to specify a name by which the internal signal 5 associated with the communication block 6 will be accessed outside of the modeling environment. The name given in the dialog box does not necessarily have to match the name of the internal signal 5 that is used within the modeling environment. This capability allows the designer to change the name of that signal within the decorated system model 100 at some later point without having to change the application employed to access the internal signals 5 outside the modeling environment. Furthermore, entirely different models may employ the same communication blocks 6 so that a single client application may be utilized for each model, saving any time required in developing that application.

In the disclosed embodiments, the communication functional blocks 6 are implemented as "S-functions," described above. In other words, the communication blocks 6 are defined by way of sections of software which describe and exhibit the functionality of the associated communication block 6. In turn, the S-functions utilize a Dynamic Link Library (DLL), provided for by embodiments of the present invention (step 430 of FIG. 4 and FIG. 5), that allows the internal signal 5 connected with the communication block 6 associated with that S-function to be exposed. Generally speaking, a DLL is a software file that may be linked with an executable program at run-time, instead of at the time the executable program is built. DLLs are commonly used in Win32 systems to provide flexibility in program configurations by allowing decisions concerning which portions of software are to be run by an executable program to be made during the execution of the program.

The DLL associated with the communication blocks 6 includes code that allows read and write access to the associated internal signals 5 from a client application by way of an executable, provided by embodiments of the invention (step 430 of FIG. 4 and FIG. 5), that is registered on the computing platform as a Component Object Model (COM) technology server. COM is a widely-used software architecture definition specified by Microsoft Corporation that allows software "components," or portions of software, that have been written by separate software developers in a variety of languages to intercommunicate. Basically, the COM architecture eases integration of disparate pieces of software to perform some integrated function by defining a framework governing how those pieces will communicate with each other. Thus, the use of COM technology allows information concerning the internal signals 5 to be passed from the modeling environment through the DLL to a concurrently-running client application 450, which can then utilize that information to analyze and control the internal execution of the decorated system model 100 running within the modeling environment 440.

Although the specific embodiments of the invention herein disclosed implement COM technology, other methods that allow such interfacing between diverse sections of software executing on a computer may be employed. For example, a more comprehensive interfacing technology, Microsoft® ".NET", which employs a set of eXtensible Markup Language (XML) Web services to allow interconnectivity between portions of software, may also be utilized. Additionally, other methods of intercommunication between diverse sections of software, including, but not limited to, LAN TCP/IP (Local Area Network—Transmission Control Protocol/Internet Protocol) and shared memory schemes, may be employed in lieu of a COM interface.

As mentioned earlier, another embodiment of the invention, as shown in FIG. 5, allows information concerning the internal signals 5 of the decorated system model 100 to be accessed from the software model 230 representing the decorated system model 100. The software model 230 is a software language version of the decorated system model 100, which is generated by a code-generation tool 220, such as RTW. The software model 230 can be executed either in conjunction with the modeling environment, or in the absence of the modeling environment, such as on a completely different computing platform. Since the software model 230 includes the communication blocks 6 specified by the user as part of the system model 1, the software model 230 allows access to the same internal signals 5 that are allowed when the decorated system model 100 is executed.

One major benefit of utilizing COM technology in the embodiments of the present invention is that the technology is employed across essentially all Win32-based platforms, thus making the task of accessing the internal signals 5 from the software model 230 during execution relatively elementary. However, other methods of interfacing between the software model 230 and an application having access to the internal signals 5 of the software model 230 may also be employed, such as .NET and LAN TCP/IP, mentioned above.

Generally speaking, the internal signals 5 of the software model 230 may be accessed in at least two different ways. The signals can be accessed while the software model 230 is executing. Alternately, the internal signals 5 may be accessed by bringing the interface containing those signals online before the software model 230 begins execution by way of an eXtensible Markup Language (XML) file.

Figure 6:
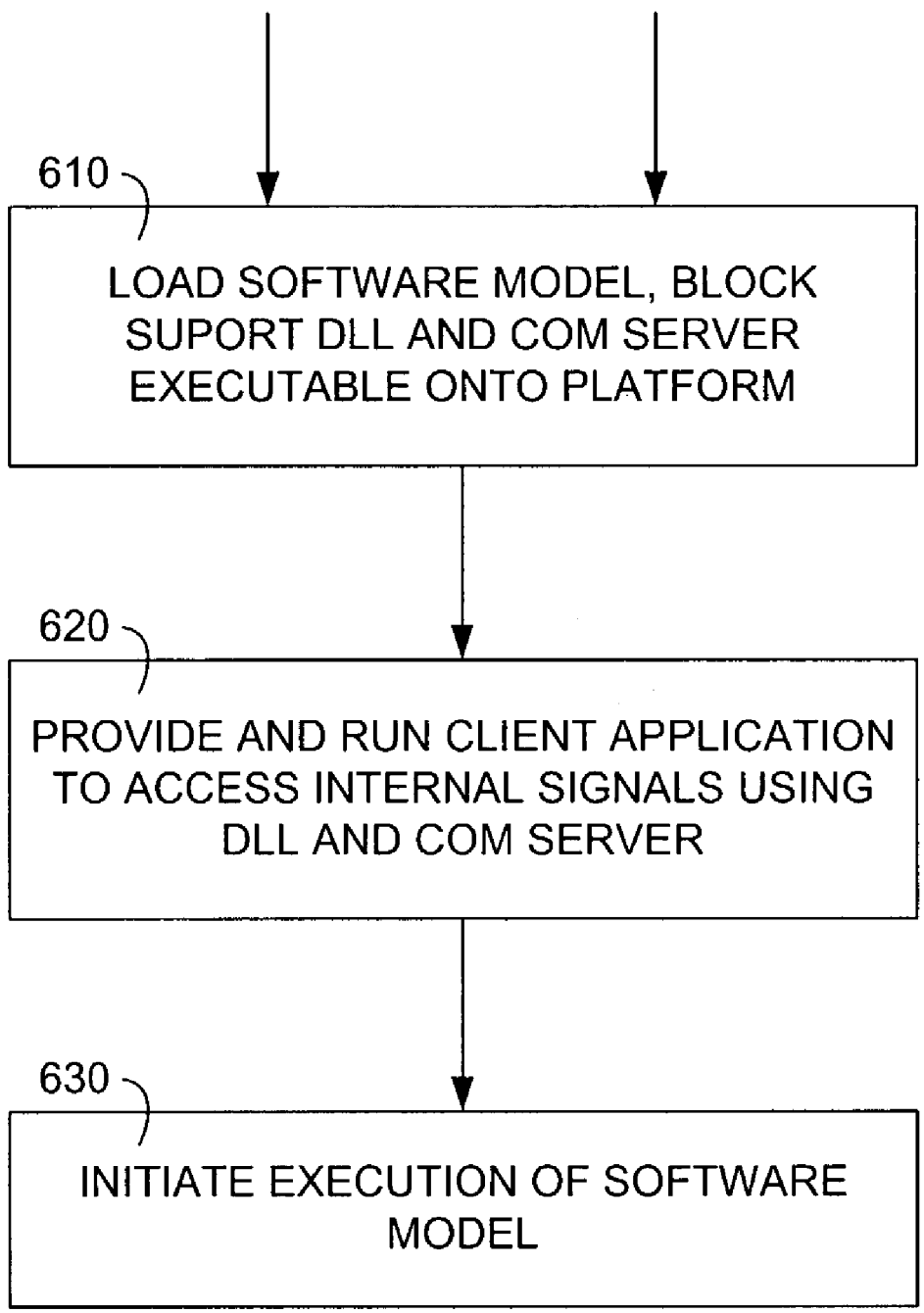
FIG. 6 is a flow chart of a possible final portion of the method of FIG. 5.

In the first example, as shown in FIG. 6, the software model 230 is loaded on a Win32 platform, along with the DLL and the executable mentioned above, with the executable being registered on the platform as a COM server (step 610 of FIG. 6). Execution of a client application that can access and respond to the internal signals 5 of the software model 230 is then initiated (step 620 of FIG. 6). The client application awaits events by way of COM technology that result from execution of the software model 230. Once execution of the software model 230 is initiated on the platform (step 630 of FIG. 6), the interface for the internal signals 5 is defined, to which the client application may then react due to its access to those signals by way of COM.

Figure 7:
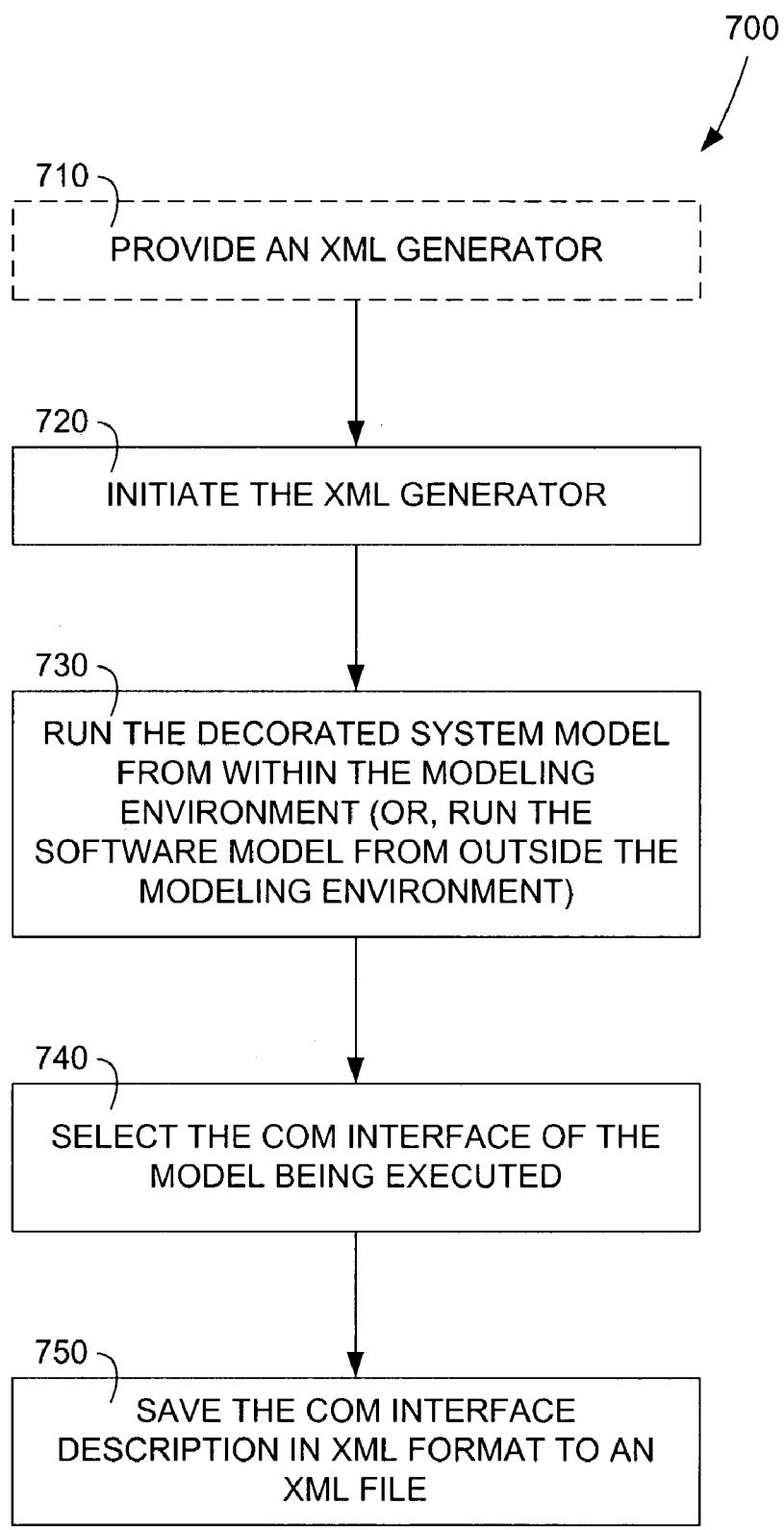
FIG. 7 is a flow chart showing in greater detail the step of FIG. 5 of generating an interface definition file.
Figure 8:
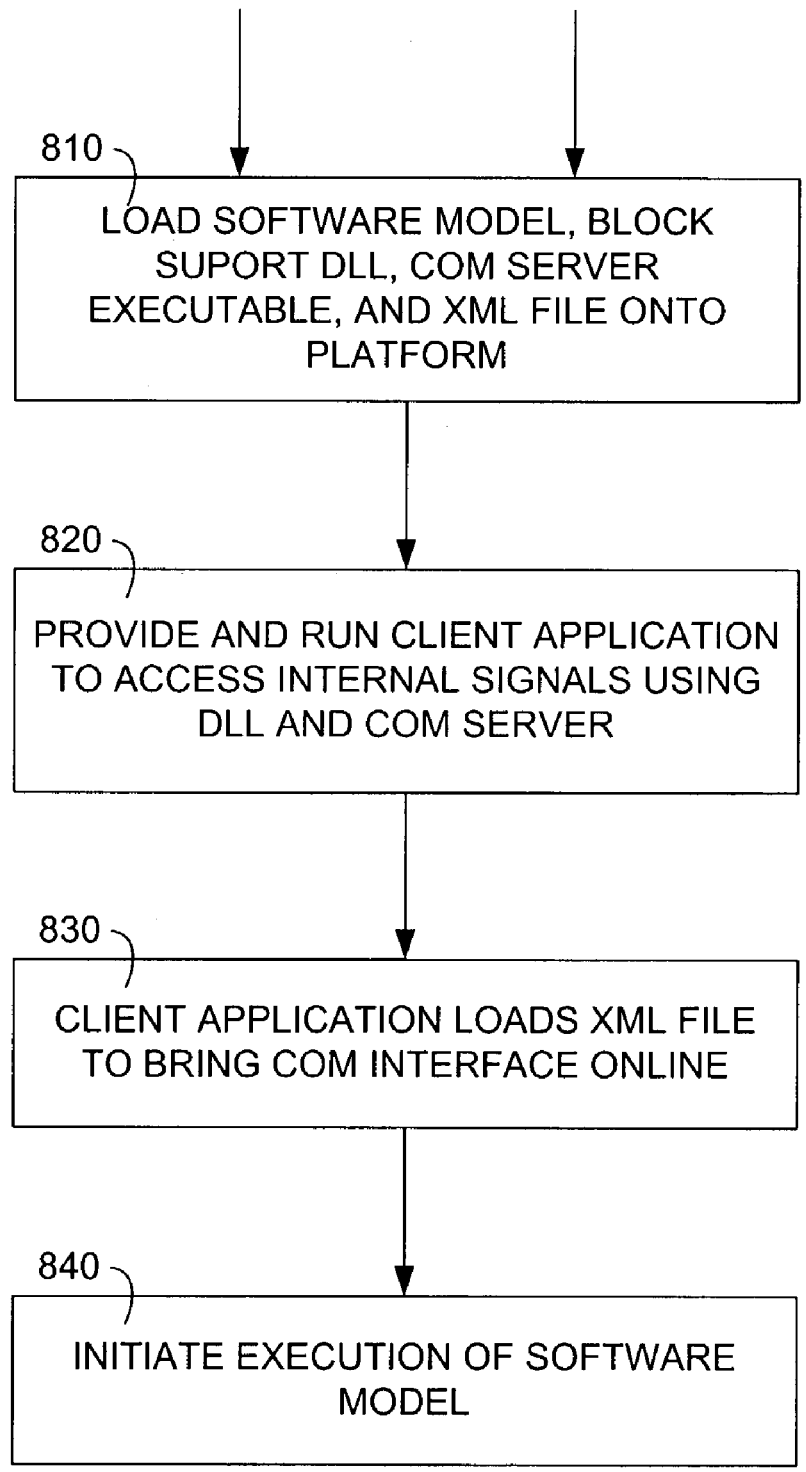
FIG. 8 is a flow chart of an alternate final portion of the method of FIG. 5, using the interface definition file from FIG. 7.

In the second example, as shown in FIG. 8, the designer may desire the client application to have access to the software model's COM interface defining the internal signals 5 prior to the execution of the software model 230. In that case, an XML file describing that interface may be generated within the modeling environment at the time the decorated system model 100 is specified (step 700 of FIG. 5, shown in greater detail in FIG. 7). A special purpose application that generates the associated XML file from a COM interface definition may be provided by an embodiment of the invention for such a purpose (step 710 of FIG. 7). In this embodiment, execution of this application, which may be termed an XML generator, is initiated first (step 720). The decorated system model 100 is then run from within the modeling environment (step 730). The XML generator then selects the decorated system model 100 via its COM interface (step 740), which keeps the COM interface of the decorated system model 100 within computer memory when no other clients require it. The XML generator then saves the interface description in XML format to an XML file (step 750). Alternately, the XML file may be generated on the target platform, outside of the modeling environment, by starting the XML generator, followed by initiating execution of the software model 230, thus allowing the XML generator to save the COM interface for the software model 230 to an XML file, as indicated in FIG. 7.

As then displayed in FIG. 8, once the XML file has been generated, it may be copied to the target computing platform along with the COM server, the DLL, and the software model (step 810). When execution of the client application is then initiated (step 820), the availability of the XML file to the COM server will allow the client application access to the specifics of the COM interface of the software model 230 prior to the software model 230 being executed on the platform (step 830). As in the previous example, the software model 230 may then be executed (step 840), with the client application running concurrently with the software model 230, accessing the internal signals 5 of the software model 230 during its execution.

One advantage of the disclosed embodiments of the invention is that a single client application may be utilized for a multitude of system or software models, regardless of what modeling environment is employed. If a standard COM interface is implemented with each of the models involved, a single client application implementing that interface may be used with all of those models. Use of the same communication blocks 6 for each model will facilitate the development of a COM interface for each, thus allowing access to each model by way of a singular client application implementing that same COM interface.

The functionality provided by the client application in accessing the internal signals 5 of the decorated system model 100 or the software model 230 is defined based on the needs of the particular dynamic system being simulated. In essentially all cases, read access by the client application of all exposed internal signals 5 of the model would be provided. Graphical representations and analysis of the internal signals 5 may also be employed to further the designer's grasp of the internal workings of the model being simulated. Further, the client application may further allow manual or programmable modification of the internal signals 5 to alter the operation of the model being simulated in order to aid the designer in determining effective modifications to the design of the associated system.

The client application may take any of a number of forms. For example, the client application could be a "model browser," which is a special purpose application devised specifically to allow the user access to the internal signals 5 of a concurrently running system model or software model. The browser typically is a Win32 application that communicates via the COM interface with the model. The data representing the internal signals 5 is then accessible via the browser for monitoring and possible modification of those signals.

Alternately, the client application may be a specific instantiation of a more general purpose program, such as a Microsoft Excel® workbook. Such a program would allow the same type of access to the internal signals 5 of the system model or software model as described for the model browser. Different spreadsheets of the workbook could also provide a different view of the operation of the model. For example, one spreadsheet could depict each of the internal signals 5, their data types and current values. Other sheets may display a graphical representation of internal signals 5 of interest.

From the foregoing, the embodiments of the invention discussed above have been shown to provide a method of allowing access to the internal signals of a system model or software model of a dynamic system outside the original modeling environment. Furthermore, other specific systems and methods embodying the invention are also possible. Therefore, the present invention is not to be limited to the specific forms so described and illustrated; the invention is limited only by the claims.

What is claimed is:

1. A method for adapting a simulation model, the method comprising the steps of:
   providing a designer of the simulation model the ability to select from within a modeling environment at least one signal internal to the model to be exposed to a client application;
   modifying said simulation model to expose said at least one signal internal to the model; and
   allowing access by the client application, by way of interfacing software, to the at least one signal internal to the model.

2. The method of claim 1, wherein the model is a system model defined within the modeling environment.

3. The method of claim 1, wherein the model is a software model based on a system model defined within the modeling environment.

4. The method of claim 1, further comprising the step of generating a system model.

5. The method of claim 4, further comprising the step of generating a software model based on the system model.

6. The method of claim 1, wherein the providing step further comprises providing communication functional blocks to decorate the model, wherein each of the communication functional blocks provides access to at least one of said at least one signal internal to the model.

7. The method of claim 6, wherein the interfacing software comprises:
   a Component Object Model (COM) server executable configured to provide for the client application access to one or more of the at least one signal internal to the model; and
   a block support Dynamic Link Library (DLL) configured to expose the at least one signal internal to the model that is associated with the communication functional blocks to the COM server executable.

8. The method of claim 7, wherein the interfacing software further comprises:
   an eXtensible Markup Language (XML) generator configured to generate an XML file that provides to the COM server executable a COM interface definition of the one or more signals internal to the model that is associated with the communication functional blocks of the model.

9. A program storage medium readable by a computer system, embodying a program executable by the computer system to perform method steps for adapting a simulation model, the method steps comprising:
   providing a designer of the simulation model the ability to select from within a modeling environment at least one signal internal to the model to be exposed to a client application;
   modifying said simulation model to expose said at least one signal internal to the model; and
   allowing access by the client application, by way of interfacing software, to the at least one signal internal to the model.

10. The program storage medium of claim 9, wherein the model is a system model defined within the modeling environment.

11. The program storage medium of claim 9, wherein the model is a software model based on a system model defined within the modeling environment.

12. The program storage medium of claim 9, the method steps further comprising the step of generating a system model.

13. The program storage medium of claim 12, the method steps further comprising the step of generating a software model based on the system model.

14. The program storage medium of claim 9, wherein the providing step further comprises providing communication functional blocks to decorate the model, wherein each of the communication functional blocks provides access to at least one of said at least one signal internal to the model.

15. The program storage medium of claim 14, wherein the interfacing software comprises:
 a Component Object Model (COM) server executable configured to provide for the client application access to one or more of the at least one signal internal to the model; and
 a block support Dynamic Link Library (DLL) configured to expose the at least one signal internal to the model that is associated with the communication functional blocks to the COM server executable.

16. The program storage medium of claim 15, wherein the interfacing software further comprises:
 an eXtensible Markup Language (XML) generator configured to generate an XML file that provides to the COM server executable a COM interface definition of the one or more signals internal to the model that is associated with the communication functional blocks of the model.

17. A program storage medium readable by a computer system, the program storage medium embodying a program that is executable by the computer system, the program comprising:

communication functional blocks employable by a designer to decorate a simulation model to expose at least one signal internal to the model, wherein a communication functional block is associated with each of the at least one signal internal to the model; and
 interfacing software configured to allow access by a client application to the at least one signal internal to the model.

18. The program storage medium of claim 17, wherein the model is a system model defined within the modeling environment.

19. The program storage medium of claim 17, wherein the model is a software model based on a system model defined within the modeling environment.

20. The program storage medium of claim 17, wherein the interfacing software comprises:
 a Component Object Model (COM) server executable configured to provide for the client application access to one or more of the at least one signal internal to the model; and
 a block support Dynamic Link Library (DLL) configured to expose the at least one signal internal to the model.

21. The program storage medium of claim 20, wherein the interfacing software further comprises:
 an eXtensible Markup Language (XML) generator configured to generate an XML file that provides to the COM server executable a COM interface definition of the at least one signal internal to the model that is associated with the communication functional blocks of the model.

* * * * *